(12) United States Patent
Park (10) Patent No.: US 7,460,210 B2
(45) Date of Patent: Dec. 2, 2008

(54) AUTO FOCUS SYSTEM, AUTO FOCUS METHOD, AND EXPOSURE APPARATUS USING THE SAME

(75) Inventor: Dong-Woon Park, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 137 days.

(21) Appl. No.: 11/269,603

(22) Filed: Nov. 9, 2005

(65) Prior Publication Data

US 2006/0103824 A1    May 18, 2006

(30) Foreign Application Priority Data

Nov. 16, 2004  (KR) ............... 10-2004-0093738

(51) Int. Cl.
    *G03B 27/42* (2006.01)
(52) U.S. Cl. ............... 355/53; 355/67; 355/72
(58) Field of Classification Search ............... None
    See application file for complete search history.

(56) References Cited

U.S. PATENT DOCUMENTS

| | | | | |
|---|---|---|---|---|
| 6,191,429 B1 * | 2/2001 | Suwa | ............... | 250/548 |
| 6,781,670 B2 | 8/2004 | Krautschik | | |
| 6,809,794 B1 | 10/2004 | Sewell | | |
| 6,813,000 B1 * | 11/2004 | Nishi | ............... | 355/53 |
| 7,123,345 B2 * | 10/2006 | Sugihara et al. | ............... | 355/53 |
| 7,242,455 B2 * | 7/2007 | Nei et al. | ............... | 355/53 |
| 7,433,015 * | 10/2008 | Mulkens et al. | ............... | 355/30 |
| 2004/0130691 A1 * | 7/2004 | Boonman et al. | ............... | 355/53 |
| 2006/0147821 A1 * | 7/2006 | Streefkerk et al. | ............... | 430/30 |
| 2007/0076303 A1 * | 4/2007 | Novak | ............... | 359/665 |

FOREIGN PATENT DOCUMENTS

| | | |
|---|---|---|
| JP | 10-004055 | 1/1998 |
| KR | 1998-029709 | 7/1998 |
| KR | 1020000074978 A | 12/2000 |
| WO | WO 2004/053954 A1 | 6/2004 |

OTHER PUBLICATIONS

May 9, 2008 Office Action Of Corresonding Chinese Patent Application No. 200510125335.7 With English Translation.

* cited by examiner

*Primary Examiner*—Della J. Rutledge
(74) *Attorney, Agent, or Firm*—Volentine & Whitt, PLLC (57) ABSTRACT

An auto focus system includes a stage on which a substrate is mounted, light sources that irradiate the substrate with a plurality of focus beams directed towards the substrate at different angles, sensors that detect the focus beams reflected from the substrate, and a controller that determines the relative location of a surface of the substrate according to the locations at which the focus beams are detected by the sensors and positions the substrate accordingly. To this end, the controller performs calculations that are free from the influence of variations in the refractive index of the medium through which the focus beams propagate to the surface of the substrate. Therefore, the autofocus process is carried out with a high degree of precision.

20 Claims, 5 Drawing Sheets

FIG. 3

FIG. 4

AUTO FOCUS SYSTEM, AUTO FOCUS METHOD, AND EXPOSURE APPARATUS USING THE SAME

BACKGROUND OF THE INVENTION

1. Field of the Invention

The present invention relates to an exposure apparatus of photolithographic equipment for use in the manufacturing of semiconductor devices or the like. More particularly, the present invention relates to an auto focus system of the exposure apparatus that positions a substrate for exposure in photolithographic equipment.

2. Description of the Related Art

Generally, the manufacturing of a semiconductor device includes a photolithographic process in which a fine pattern is formed on a wafer (hereinafter, referred to as a "substrate"). The photolithographic process begins with an exposure process in which a beam of light is directed through a reticle and onto the substrate. In this way, a pattern borne by the reticle is transferred to a layer of photoresist on the substrate. The exposure process is thus crucial in forming a fine pattern on the substrate. In particular, the precision under which the beam of light is focused on the substrate is one very important factor in forming a high-quality pattern, especially a fine multi-layered pattern, on the substrate. To this end, an auto focus system is used to position the substrate in the exposure apparatus such that the image of the pattern borne by the reticle is focused precisely on the plane of the photoresist layer during the exposure process.

A conventional auto focus system irradiates the substrate with a so-called focus beam and detects the beam reflected from the substrate to discern the state of the focus of the exposure apparatus. More specifically, the focus beam is directed onto the substrate obliquely and the focus beam reflected from the surface of the substrate is received by a sensor. The sensor senses the location at which the light is incident thereon to determine the relative position of the substrate. A substrate stage, on which the substrate is supported, is driven based on data produced from the output of the sensor to position the substrate in a focal plane of the exposure apparatus.

Research aimed at improving the resolution of the exposure apparatus is ongoing to meet the demand for more highly integrated semiconductor devices, i.e., devices that have finer circuit patterns. In this respect, it is known that fine patterns can be formed when the exposure light has a relatively small wavelength. Thus, past research has focused on developing and putting into practice light sources that output exposure light having small wavelengths. Typically, a KrF excimer laser emitting light having a wavelength of 248 nm or an ArF excimer laser emitting light having a wavelength of 193 nm is employed as a light source in the exposure apparatus of current photolithographic equipment. Recently, though, an F2 excimer laser has also been employed as a light source.

It is has proven technically difficult to develop light sources that output exposure light having shorter wavelengths than those mentioned above. Thus, an immersion exposure technology, that effectively increases the aperture number of the apparatus, has been suggested as a means for increasing the resolution of the exposure apparatus. The immersion exposure technology employs the existing KrF, ArF or F2 excimer lasers as the light source; however, an immersion medium is interposed between the substrate and an optical system of the exposure apparatus to increase the aperture number. Such immersion exposure technology is disclosed in U.S. Pat. Nos. 6,781,670 and 6,809,794.

More specifically, in exposure apparatus that employs the immersion exposure technology, a liquid (immersion) medium is provided between the substrate and the optical system. However, there is a problem in that the refractive index of the immersion medium varies locally due to bubbles or temperature changes generated therein by the light directed therethrough.

Such local variations in the refractive index of the immersion medium cause a very large problem in the auto focus process. That is, when the focus beam passes through the immersion medium during the auto focus process, the optical path of the beam may assume an unexpected direction if the beam passes through a portion of the immersion medium in which the refractive index varies. In this case, a focus error occurs. This focus error may be also generated by the air or other material through which the focus beam propagates on its way to the substrate. That is, a focus error due to variations in the refractive index of a medium through which the focus beam must pass can be generated in a dry exposure apparatus in addition to an exposure apparatus employing a liquid immersion medium.

SUMMARY OF THE INVENTION

An object of the present invention is to solve the aforementioned problems of the prior art.

More specifically, an object of the present invention is to provide an auto focus system and auto focus method that are not influenced by variations or fluctuations in the index of refraction of the medium through which a focus beam propagates.

Likewise, it is an object of the present invention to provide an exposure apparatus having such an auto focus system, whereby a substrate can be positioned optimally for the exposure process.

It is yet another object of the present invention to provide an immersion exposure apparatus that employs an immersion medium between its optical system and a substrate stage to enhance the resolution of the apparatus, and which apparatus includes an auto focus system that is not influenced by variations in the index of refraction of the immersion medium, whereby a very fine pattern can be precisely formed on a substrate.

According to one aspect of the present invention, there is provided an auto focus system including a stage for supporting a substrate, measuring light sources that emit a plurality of focus beams towards the substrate at different angles, sensors that receive the focus beams reflected from the substrate and output signals indicative of locations at which the reflected focus beams are received, and control means that determines the relative position of the substrate based on the output of the sensors and controls the position of the stage accordingly. To this end, the control means has a calculation unit that calculates a focus changing value of the substrate indicative of the position of a surface of the substrate relative to a reference plane.

Preferably, the auto focus system has first and second measuring light sources oriented to emit a first focus beam and a second focus beam to the same fixed location in the system at the surface of the substrate, and first and second sensors positioned in the system to receive the first and second focus beams, respectively.

In this case, the calculation unit is configured to execute an algorithm represented by the following equation:

$$f = \frac{1}{2}\left(\frac{-\theta_0^2(y_0^{(1)} + y_L^{(1)}) + \theta_0^1(y_0^{(2)} - y_L^{(2)})}{(\theta_0^{(1)} - \theta_0^{(2)})}\right)$$

based on an x, y coordinate system in which the x axis is parallel to the stage and the y axis is perpendicular to the stage, and wherein f is the focus changing value, $y_0^{(1)}$ is a value representing the y coordinate of the location from which the first focus beam emanates from the first measuring light source, $y_0^{(2)}$ is a value representing the y coordinate of the location from which the second focus beam emanates from the second measuring light source, $\theta_0^{(1)}$ is an angle of incidence of the first focus beam corresponding to the angle subtended between the first focus beam emanating from the first measuring light source and the x axis, $\theta_0^{(2)}$ is an angle of incidence of the second focus beam corresponding to the angle subtended between the second focus beam emanating from the second measuring light source and the x axis, $y_L^{(1)}$ is a value representing the y coordinate of the location at which the reflected first focus beam is received by the first sensor, and $y_L^{(2)}$ is a value representing the y coordinate of the location at which the reflected second focus beam is received by the second sensor.

In addition to a calculation unit, the control means includes a unit that will adjust the position of the stage relative to the optical system of the exposure unit so as to reposition the substrate in preparation for the exposure process. This unit may include a stage controller, and a stage driving unit connected to the stage so as to drive the stage under the command of the stage controller. The stage controller compares the focus changing value calculated by the calculation unit with a focus reference value of the substrate and outputs a control signal representative of the difference between the focus changing value and the reference value. The stage driving unit receives the control signal from the stage controller and drives the stage by an amount based on the control signal.

According to another aspect of the present invention, there is provided an auto focus method including steps of irradiating a substrate with a plurality of focus beams at different angles relative to a plane extending parallel to the substrate, detecting locations to which the focus beams are reflected from the substrate, assigning values to the locations, and controlling the position of the substrate according to the assigned values. Preferably, the substrate is simultaneously irradiated by the focus beams.

Again, these beams may consist of a first focus beam and a second focus beam. In this case, a focus changing value of the substrate indicative of the height of a surface of the substrate relative to a reference plane is calculated, and the position of the substrate is adjusted on the basis of the focus changing value. The above-mentioned equation may be used for calculating the focus changing value of the substrate.

According to still another aspect of the present invention, there is provided an exposure apparatus including the auto focus system described above, an exposure light source, and an optical system interposed between the stage and the exposure light source so as to project light emitted by the exposure light source onto a substrate mounted to the stage.

According to still another aspect of the present invention, the exposure apparatus may be an immersion exposure apparatus having an immersion medium occupying a gap between the optical system and the stage. The immersion medium may be a liquid. Also, the immersion medium may be provided in a container or may be fed by a supply system so as to flow through the gap between the optical system and the stage.

BRIEF DESCRIPTION OF THE DRAWINGS

The above and other features and advantages of the present invention will become more apparent from the following detailed description of the preferred embodiments thereof made with reference to the attached drawings in which.

DETAILED DESCRIPTION OF THE PREFERRED EMBODIMENTS

Exposure apparatus including an auto focus system of the present invention will now be described in detail with reference to the accompanying drawings.

Figure 1:
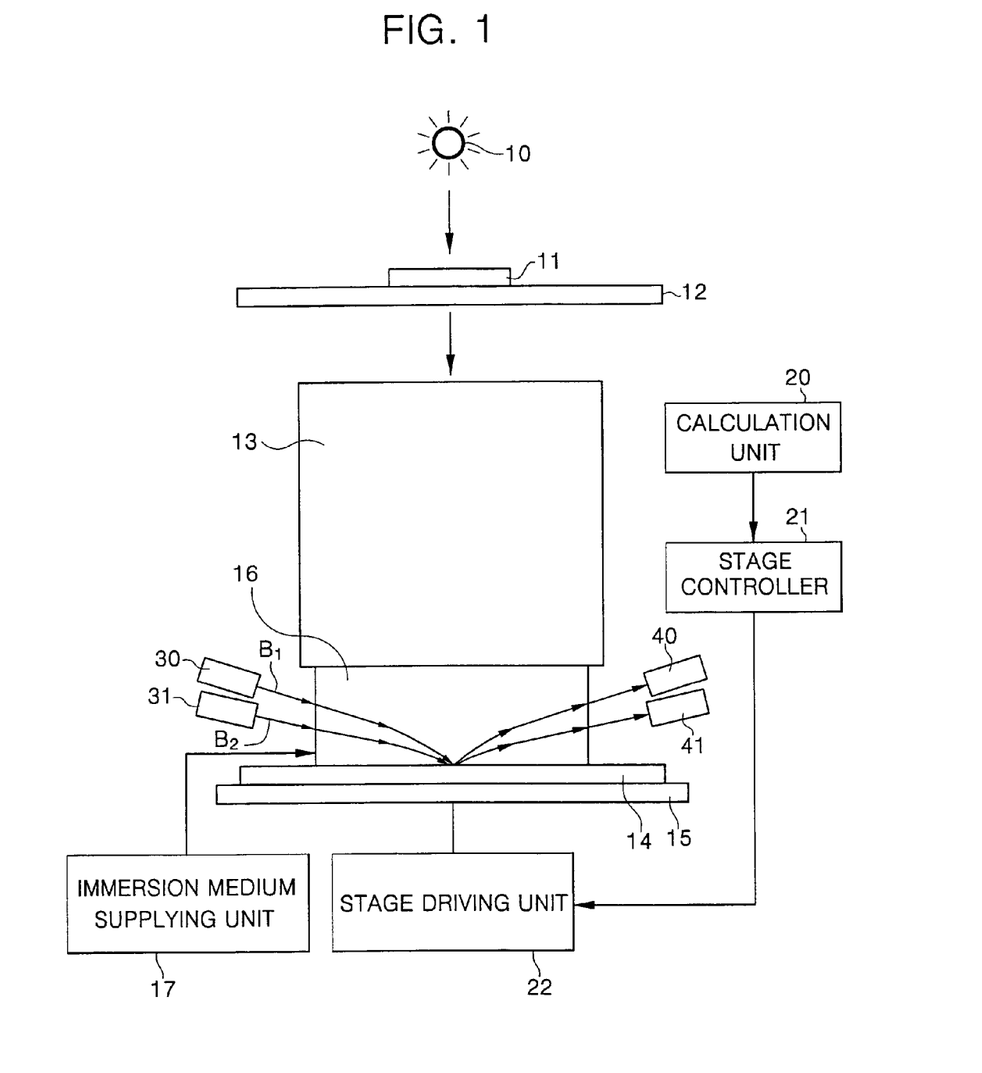
FIG. 1 is a schematic diagram of an immersion exposure apparatus including an auto focus system according to the present invention.

Referring first to FIG. 1, an immersion exposure apparatus having an auto focus system according to the present invention includes a light source 10, a reticle stage 12 for supporting a reticle 11 thereon, an optical system 13, a substrate stage 15 that is located under the optical system 13 and supports a substrate 14 thereon, an immersion medium 16 that is interposed between the substrate stage 15 and the optical system 13, and a stage driving unit 22 for aligning the substrate stage 15 with the optical system 13.

An excimer laser is used as the light source 10. The excimer laser may be a KrF excimer laser or an ArF excimer laser. In the present embodiment, an ArF excimer laser emitting a beam of light having a wavelength shorter than that of the beam emitted by a KrF excimer laser is used. However, a light source that emits light having an even smaller wavelength, such as an F2 excimer laser, may be used.

The reticle 11 is located in the optical path of the light output by the light source 10. The reticle 11 is formed of a quartz plate that bears a pattern corresponding to a circuit pattern to be formed on the substrate 14. The reticle 11 is mounted on the reticle stage 12. The reticle stage 12 is aligned with the optical system 13, etc., by a separate driving device (not shown).

The optical system 13 includes a plurality of lenses having the same optical axis and providing a reducing projection magnification. That is, when the reticle is illuminated with light emitted by the light source 10, the image of the pattern of the reticle 11 is reduced by the optical system 13 and projected onto a layer of photoresist on the substrate 14. Also, the optical system 13 is supported so that it can be moved along the optical axis to adjust the position of the lenses relative to the light source 10 and reticle stage 15.

The substrate 14 on which a pattern will be formed is mounted on the substrate stage 15. The immersion medium 16 is supplied from a medium supplying unit 17 to flow through a region of the exposure apparatus located between the optical system 13 and the substrate 14. Alternatively, a container filled with the immersion medium may be interposed between the optical system 13 and the substrate 14.

The auto focus system is provided at one side of the substrate stage 15. The auto focus system of the present invention employs a non-TTL (through the lens) method.

Figure 2:
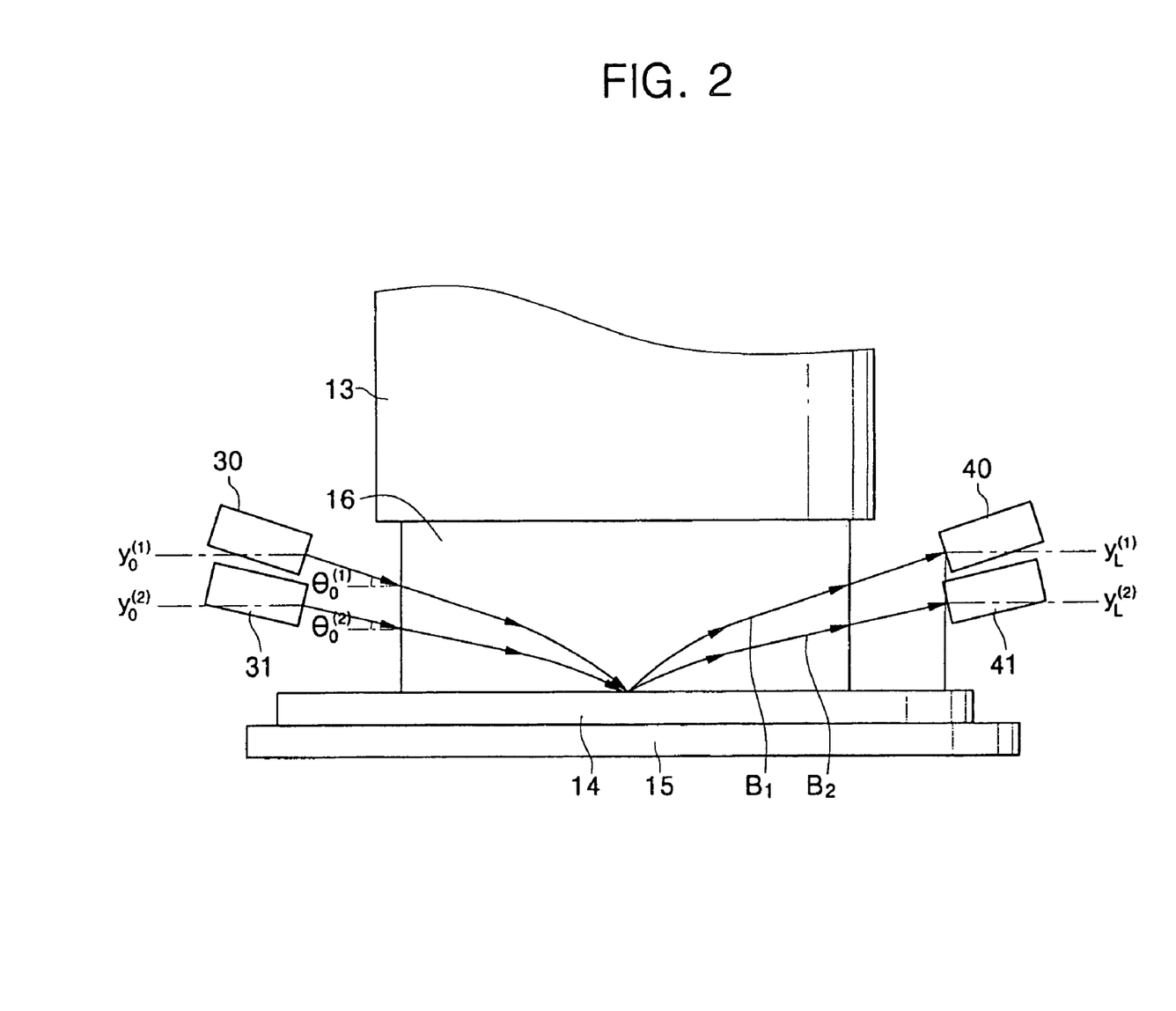
FIG. 2 is an enlarged view of a portion of the auto focus system shown in FIG. 1, illustrating a state in which a substrate is irradiated with focus beams of the system according to the present invention.

The auto focus system of the present invention includes a first measuring light source 30 for irradiating the substrate 14 with a first focus beam B1 and a second measuring light source 31 for irradiating the substrate 14 with a second focus beam B2, as shown in FIGS. 1 and 2.

The first measuring light source 30 and the second measuring light source 31 direct the first focus beam B1 and the second focus beam B2 toward the same location on the substrate 14 but at different angles. Preferably, the focus beams B1 and B2 are directed onto the substrate 14 at the same time because the refractive index of the immersion medium 16 through which the focus beams B1 and B2 pass may change over time as external conditions, such as temperature, change.

Also, the auto focus system includes first and second sensors 40 and 41 at a side of the stage 15 opposite that at which the first measuring light source 30 and the second measuring light source 31 are provided. The first sensor 40 is positioned to receive the first focus beam B1, and the second sensor 41 is positioned to receive the second focus beam B2. A calculation unit 20 calculates a value, representative of the relative position of the stage 15 along the optical axis, using measurements obtained by the sensors 40 and 41. The auto focus system also includes a stage controller 21 for controlling the stage driving unit 22 of the substrate stage 15 according to the value calculated in the calculation unit 20.

Now, if the refractive index n of the immersion medium 16 is not uniform, the focus beams B1 and B2 refract (bend) as they pass through the boundary/boundaries of portions of the immersion medium having the different indices of refraction. In this case, the locations to which the focus beams B1 and B2 are reflected from the substrate 14 differ from the locations to which the focus beams B1 and B2 would have been reflected had the refractive index of the immersion medium 16 been uniform. Accordingly, the output of the sensors 40, 41 is affected by the non-uniformity of the refractive index of the immersion medium.

Nonetheless, the auto focus system can determine the proper location of the substrate 14 because the operations performed by the calculation unit 20 to calculate a focus changing value representative of the true location of the stage 15 take into account the variations of the refractive index of the immersion medium 16 and the degree to which the variations in the refractive index of the immersion medium 16 affect the locations on the sensors 40, 41 to which the beams B1 and B2 are reflected. Therefore, an accurate auto focus process can be performed even though the refractive index of the immersion medium 26 varies.

In order to perform the calculation of the present invention, first, the paths of the beams B1 and B2 are each expressed by Equation 1 according to *Born & Wolf's Principles of Optics* (p. 130).

$$\frac{d}{ds}\left(n\frac{d\bar{r}}{ds}\right) = \nabla n \qquad \text{[Equation 1]}$$

Here, $r=(x, y)$ is a vector representing the path of a focus beam B1, B2, s is the distance the focus beam B1, B2 traverses between the light source 30, 31 and the sensor 40, 41, and n is the refractive index of the medium through which the beam B1, B2 passes. If the direction parallel to the substrate 14 is x and the direction perpendicular to the substrate 14 is y in FIG. 2, Equation 1 can be rewritten as Equations 2 for the components x and y.

$$\frac{d}{ds}\left(n\frac{dx}{ds}\right) = \frac{\partial n}{\partial x} \qquad \text{[Equations 2]}$$
$$\frac{d}{ds}\left(n\frac{dy}{ds}\right) = \frac{\partial n}{\partial y}$$

However, the distance between the optical system 13 and the substrate 14 in the exposure apparatus is only several mm, i.e., is very small. On the contrary, the distances between the measuring light sources 30 and 31 and the sensors 40 and 41 are relatively large. That is, the distance in the y direction is much shorter than that in the x direction. Accordingly, variations in the refractive index n in the y direction can be ignored and the value n can be considered as only a function of x. That is, the refractive index of the immersion medium 16 can be expressed as $n=n(x)$.

The angle of incidence θ at which a focus beam is directed relative to the normal of the immersion medium (see FIG. 2) can be expressed by Equations 3 and 4.

$$\theta = \frac{dy}{dx} \qquad \text{[Equation 3]}$$

$$\frac{d}{ds} = \frac{\partial}{\partial x} + \frac{\partial}{\partial y}\frac{dy}{dx} \qquad \text{[Equation 4]}$$

Accordingly, if $n=n(x)$ and Equation 4 are substituted into Equation 2, Equation 5 is obtained.

$$\frac{d}{ds}\left(n\frac{dy}{dx}\right) = \frac{\partial n}{\partial y} = 0 \qquad \text{[Equation 5]}$$

The result $n\theta=\text{const}$ from Equation 3 or $n(dy/dx)=\text{const}$ according to Equation 5 is obtained. An equation for calculating a focus changing value f using two focus beams can now be induced from these results.

First, if the angles at which the focus beams emanate from the measuring light sources 30 and 31 relative to the normal of the immersion medium are $\theta_0$, values representing the locations of the measuring light sources 30 and 31 are $y_0$, and the index of refraction of the medium through which the beam travels is $n_0$, Equation 6 and Equation 7 are obtained by integrating Equation 6 when $n\theta=\text{const}$ or $n(dy/dx)=\text{const}$.

$$dy = \frac{n_0}{n(x)}\theta_0 dx \qquad \text{[Equation 6]}$$

$$y(x) = \theta_0 \int_0^x \frac{n_0}{n(x)}dx + y(0) \qquad \text{[Equation 7]}$$

Figure 3:
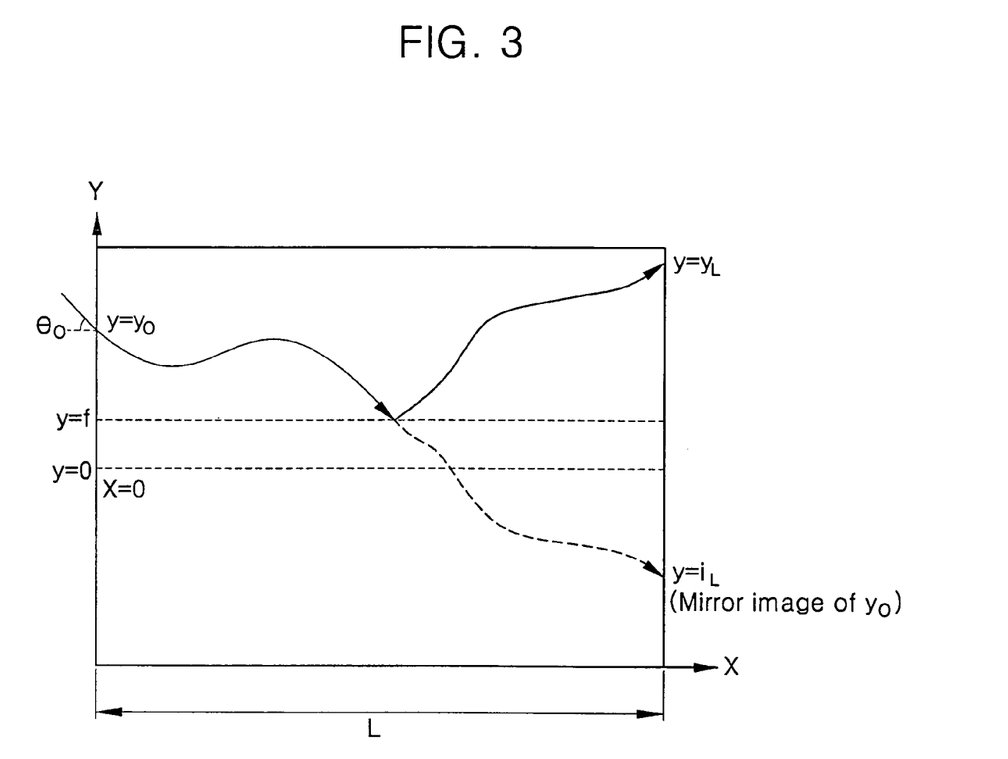
FIG. 3 is a conceptual diagram of the irradiation of a substrate by a focus beam, illustrating a principal behind a method of focusing an exposure apparatus according to the present invention.

As shown in FIG. 3, the actual focus beams B1 and B2 are incident on the immersion medium 16 along the path of the solid line and are reflected at a location on the surface of the substrate 14 at a predetermined height f above a reference plane at y=0. The predetermined height f is the focus changing value which is sought by and obtained according to the present invention. The plane at y=0 is the focal plane of the optical system 13 and is used as a reference plane, the location of which is calculated by a separate method. As mentioned above, $\theta_0$ denotes the angles at which the focus beams B1 and B2 are output from the measuring light sources 30 and 31 relative to the normal of the immersion medium 16.

However, calculating the focus changing value f is complicated due to the reflection of the focus beams B1 and B2 at the surface of the substrate 14. Accordingly, mirror images of those portions of the focus beams B1 and B2 reflecting from the substrate at the predetermined height f are used to simplify the calculation. That is, a focus beam deflected due to the variations in the refractive index of the immersion medium arrives at the location $y_L$, as shown in FIG. 3. This location $y_L$ becomes $i_L$ for a mirror image of that portion of the beam reflecting from the surface at y=f. Accordingly, Equation 8 is obtained.

$$y_L + i_L = 2f \qquad \text{[Equation 8]}$$

Next, the location of $i_L$ is expressed by Equation 9 employing Equation 7. Here, L is the distance along the x axis from the measuring light sources 30 and 31 to the sensors 40 and 41.

$$y_L = \theta_0 \int_0^L \frac{n_0}{n(x)} dx + y_0 \qquad \text{[Equation 9]}$$

The integral component in Equation 9 is expressed by "C" in Equation 10.

$$C = \int_0^L \frac{n_0}{n(x)} dx \qquad \text{[Equation 10]}$$

Next, referring back to FIG. 2, if the first measuring light source 30 is represented by "(1)" and the second measuring light source 31 is represented by "(2)", Equation 8 and Equation 9 can be rewritten as Equations 11.

$$i_L^{(1)} = C\theta_0^{(1)} + y_0^{(1)}$$

$$i_L^{(2)} = C\theta_0^{(2)} + y_0^{(2)}$$

$$i_L^{(1)} + y_L^{(1)} = 2f$$

$$i_L^{(2)} + y_L^{(2)} = 2f \qquad \text{[Equations 11]}$$

The equations can be solved simultaneously to produce Equation 12.

$$C = \frac{(y_L^{(1)} - y_L^{(2)}) + (y_0^{(1)} - y_0^{(2)})}{(\theta_0^{(2)} - \theta_0^{(1)})} \qquad \text{[Equation 12]}$$

Therefore, the predetermined height f, which is the focus changing value representing the actual relative position of the substrate 14, can be expressed by Equation 13.

$$f = \frac{1}{2}\left(\frac{-\theta_0^2(y_0^{(1)} + y_L^{(1)}) + \theta_0^1(y_0^{(2)} - y_L^{(2)})}{(\theta_0^{(1)} - \theta_0^{(2)})}\right) \qquad \text{[Equation 13]}$$

In Equation 13, $y_0^{(1)}$ and $y_0^{(2)}$ are values representing the y coordinates of the locations from which the beams emanate from the measuring light sources 30 and 31, and $\theta_0^{(1)}$ and $\theta_0^{(2)}$ are angles of incidence of the focus beams B1 and B2 on the immersion medium 16 and are thus, predetermined values. On the other hand, $y_L^{(1)}$ and $y_L^{(2)}$ are the values of the output of the sensors 40 and 41, representing the y coordinates of the locations at which the focus beams B1 and B2 impinge the sensors 40 and 41. Hence, all of these values can be substituted into Equation 13 to solve for f.

Figure 4:
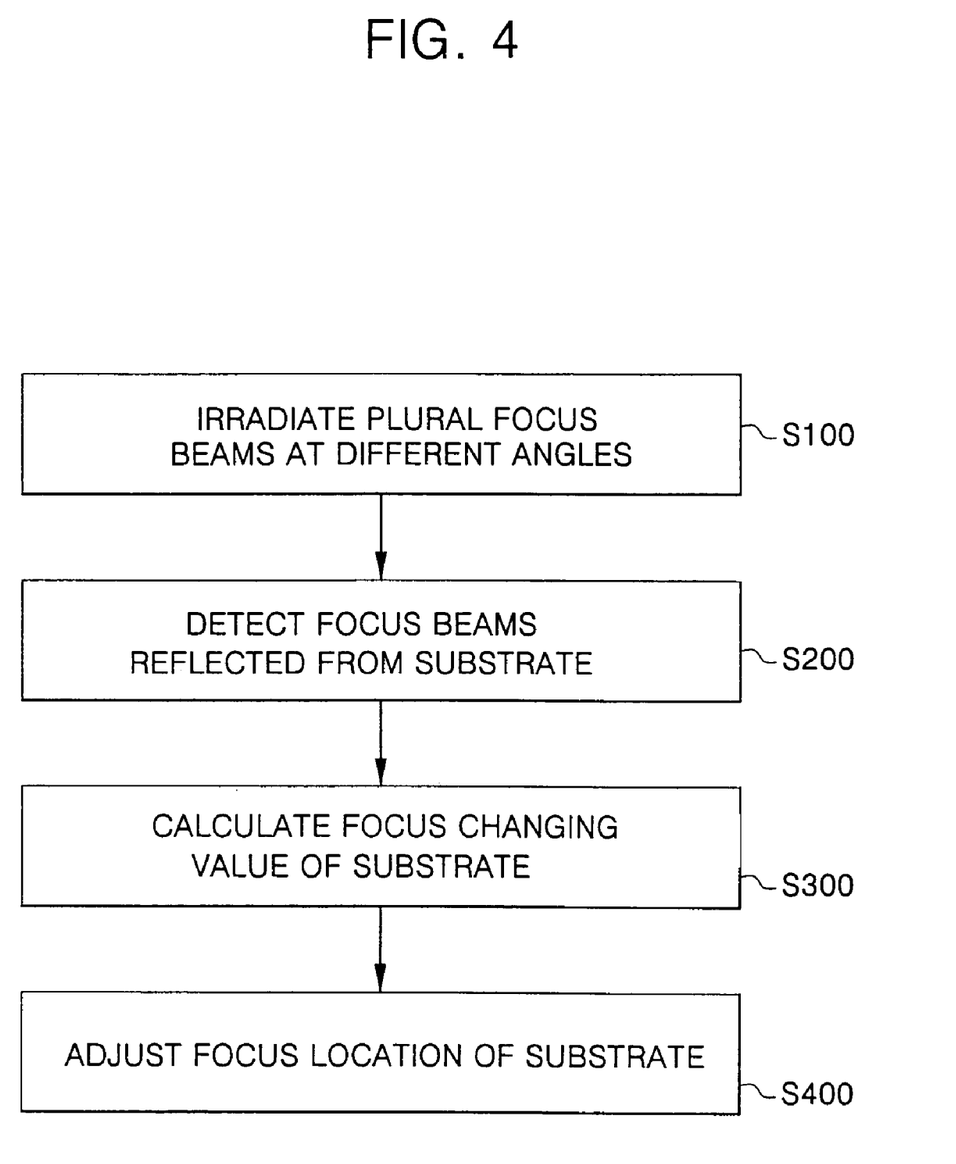
FIG. 4 is a flowchart of a method of focusing an exposure apparatus according to the present invention.

A method of focusing an exposure apparatus according to the present invention will now be described with reference to FIG. 4.

The focus measuring method of the auto focus system according to the present invention basically includes a focus beam irradiating step (S100), a focus beam detecting step (S200), and a focus location controlling step (S300 and S400).

In the focus beam irradiating step (S100), the first measuring light source 30 and the second measuring light source 31 simultaneously emit the first focus beam B1 and the second focus beam B2 toward the same portion of the substrate 14 from different locations and at different angles, respectively.

In the detecting step (S200), the first sensor 40 and the second sensor 41 detect the first focus beam B1 and the second focus beam B2 reflected from the substrate 14 and output signals whose values are indicative of the locations at which the beams B1 and B2 are received, respectively.

The controlling step includes a calculating step (S300) of receiving the values representing the locations of the first focus beam B1 and the second focus beam B2 on the first sensor 40 and the second sensor 41, of calculating from these values the focus changing value f of the substrate 14, and an adjusting step (S400) of adjusting the position of the substrate 14 according to the focus changing value f calculated in the calculating step (S300).

In this calculating step (S300), values representing the locations $y_0^{(1)}$ and $y_0^{(2)}$ from which the first focus beam B1 and the second beam B2 emanate, the angles of incidence $\theta^{o(1)}$ and $\theta_0^{(2)}$ of the first focus beam B1 and the second beam B2, and the values $y_L^{(1)}$ and $y_L^{(2)}$ produced from the output of the sensors 40 and 41 are received, and calculations are performed according to algorithms corresponding to the above-mentioned equations. Accordingly, the focus changing value f is obtained.

According to this method, the calculation of the focus changing value f removes any factor pertaining to variations in the refractive index of the immersion medium 16. Thus, the auto focus process can be performed accurately even if external conditions and the like create changes in the immersion medium that affect its index of refraction.

In the adjusting step S400, the stage controller 21 compares the focus changing value f obtained in the calculating step (S300) with the reference value (y=0). Based on the comparison, the stage controller 21 provides the stage driving unit 22 with information on the location of the substrate 14. Then, the stage driving unit 22 adjusts the stage 15 in the direction of the optical axis to place the substrate 14 at a location where the photoresist layer on the substrate 14 lies in the focal plane of the optical system 13, whereby a focused image of the pattern of the reticle 11 will be projected onto the photoresist layer.

Figure 5:
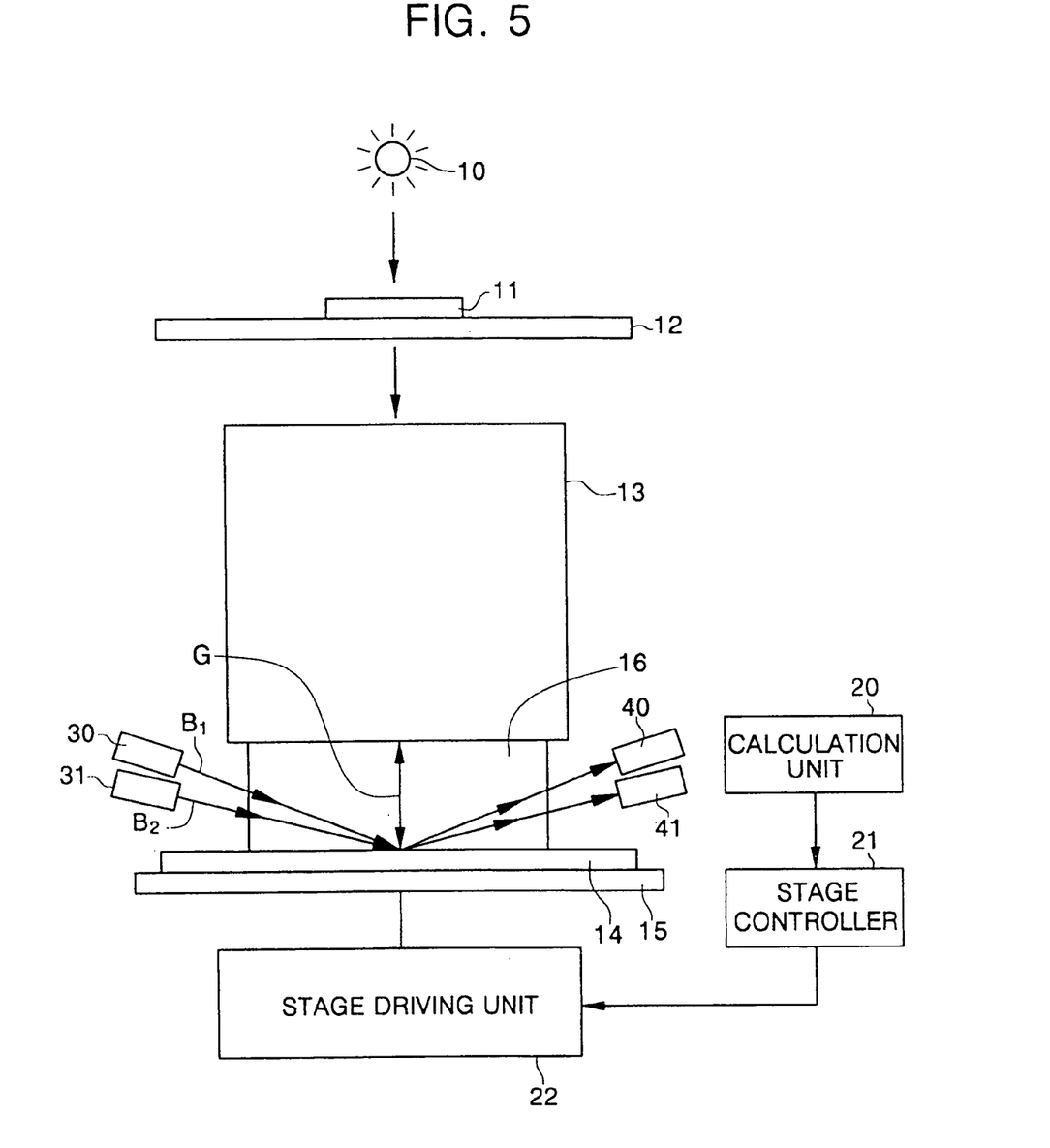
FIG. 5 is a schematic diagram of a dry exposure apparatus including an auto focus system according to the present invention.

FIG. 5 shows another embodiment of the present invention, in which the auto focus system and the auto focus method are applied to a dry exposure apparatus. In the embodiment of FIG. 5, components that are the same as those employed in the embodiment of FIG. 1 are represented by the same reference numerals and thus, a detailed description thereof will be omitted.

An immersion medium is not used in the dry exposure apparatus. However, a gap is present between the substrate 14 and the optical system 13. Nonetheless, the refractive index of the air/gas in the gap G may vary. Accordingly, the auto focus system and method allow for an accurate auto focus process to be performed similar to that described above in connection with the immersion exposure apparatus.

According to the auto focus system, the auto focus method and the exposure apparatus of the present invention, two focus beams are emitted at different angles to measure the state of focus of the substrate. Accordingly, the auto focus process factors out variations in the medium, e.g., air, liquid, or transmission solid, through which the focus beams pass, that affect the refractive index of the medium. Accordingly, the auto focus process is performed with a high degree of precision. Thus, the overall productivity of the semiconductor device manufacturing process is enhanced.

Finally, although the present invention has been described above in connection with the preferred embodiments thereof, the invention is not so limited. For example, more than two measuring light sources may be used to irradiate the substrate at a given location, or pairs of the measuring light sources may irradiate the substrate at a plurality of locations. Such modifications can be mathematically modeled rather easily by those skilled in the art by appropriately modifying the above-mentioned equations. Accordingly, such changes and modifications are within the true spirit and scope of the invention as defined by the appended claims.

What is claimed is:

1. An auto focus system comprising:
   a stage to which a substrate is to be mounted;
   optical components including measuring light sources each of which emits a focus beam, and sensors each operative to output a signal indicative of a location at which a beam of light of the type emitted by the light sources is received thereon,
   the optical components being arranged to direct the focus beams emitted by the measuring light sources at different angles, respectively, towards a substrate mounted on the stage, wherein the angle at which the focus beam propagates towards the substrate mounted on the stage is defined as the angle subtended between the focus beam and a plane that is parallel to an upper surface of the stage, and
   such that the sensors receive the focus beams reflected from the substrate such that the sensors will output signals indicative of locations at which the reflected focus beams are received thereon; and
   control means operatively connected to said sensors so as to receive the signals output by the sensors, the control means comprising a calculation unit configured to incorporate together values representing the relative locations from which the focus beams emanate from the light sources, with values representing the angles at which the focus beams propagate towards the substrate, and with values representing the locations at which the reflected focus beams are received on the sensors, respectively, and thereby calculate a focus changing value indicative of the position of a surface of a substrate mounted to the stage relative to a reference plane, and the control means operatively connected to the stage so as to control the position of the stage based on the focus changing value.

2. The system according to claim 1, wherein the measuring light sources comprise a first measuring light source oriented to emit a first focus beam at a first angle towards a fixed location above the stage and a second measuring light source oriented to emit a second focus beam at a second angle, different from the first angle, towards the fixed location.

3. The system according to claim 2, wherein the sensors comprise a first sensor positioned in the system to receive the first focus beam and a second sensor positioned in the system to receive the second focus beam.

4. The system according to claim 3, wherein the control means further comprises:
   a stage controller that compares the focus changing value with a focus reference value of the substrate and outputs a control signal representative of the difference between the focus changing value and the reference value, and
   a stage driving unit operatively connected to the stage controller and to the stage so as to receive the control signal from the stage controller and drive the stage by an amount based on the control signal.

5. The system according to claim 4, wherein the calculation unit is configured to execute an algorithm represented by the following equation:

$$f = \frac{1}{2}\left(\frac{-\theta_0^2(y_0^{(1)} + y_L^{(1)}) + \theta_0^1(y_0^{(2)} - y_L^{(2)})}{(\theta_0^{(1)} - \theta_0^{(2)})}\right)$$

based on an x, y coordinate system in which the x axis is parallel to the stage and the y axis is perpendicular to the stage, and wherein f is the focus changing value, $y_0^{(1)}$ is a value representing the y coordinate of the location from which the first focus beam emanates from the first measuring light source, $y_0^{(2)}$ is a value representing the y coordinate of the location from which the second focus beam emanates from the second measuring light source, $\theta_0^{(1)}$ is an angle of incidence of the first focus beam corresponding to the angle subtended between the first focus beam emanating from the first measuring light source and the x axis, $\theta_0^{(2)}$ is an angle of incidence of the second focus beam corresponding to the angle subtended between the second focus beam emanating from the second measuring light source and the x axis,) $y_L^{(1)}$ is a value representing the y coordinate of the location at which the reflected first focus beam is received by the first sensor, and $y_L^{(2)}$ is a value representing the y coordinate of the location at which the reflected second focus beam is received by the second sensor.

6. An auto focus method comprising:
   aiming several focus beams at different angles, respectively, towards a substrate and thereby irradiating the substrate with the focus beams, wherein the angle at which each focus beam is aimed towards the substrate is the angle subtended between the focus beam and a plane that is parallel to the plane of the substrate;
   detecting locations to which the focus beams are reflected from the substrate, respectively, and assigning values to the locations;
   incorporating together values representing the relative locations from which the focus beams are aimed towards the substrate, values representing the different angles at which the focus beams propagate towards the substrate, and the values assigned to the locations at which the reflected focus beams are detected, respectively, and thereby calculating a focus changing value indicative of the height of a surface of a substrate relative to a reference plane, and
   controlling the position of the substrate according to the focus changing value.

7. The method according to claim 6, wherein said aiming of the focus beams towards the substrate comprises aiming a first focus beam and a second focus beam towards the substrate from fixed locations at different angles relative to the plane, respectively.

8. The method according to claim 7, wherein said aiming of the focus beams towards the substrate comprises aiming the first focus beam and the second focus beam at the same location on the substrate.

9. The method according to claim 7, wherein said aiming of the focus beams towards the substrate comprises irradiating the substrate simultaneously with the first focus beam and the second focus beam.

10. The method according to claim 7, wherein the incorporating comprises executing an algorithm represented by the following equation:

$$f = \frac{1}{2}\left(\frac{-\theta_0^2(y_0^{(1)} + y_L^{(1)}) + \theta_0^1(y_0^{(2)} - y_L^{(2)})}{(\theta_0^{(1)} - \theta_0^{(2)})}\right)$$

based on an x, y coordinate system in which the x axis is parallel to the substrate and the y axis is perpendicular to the substrate, and wherein f is the focus changing value, $y_0^{(1)}$ is a value representing the y coordinate of the location from which the first focus beam emanates from the first measuring light source, $y_0^{(2)}$ is a value representing the y coordinate of the location from which the second focus beam emanates from the second measuring light source, $\theta_0^{(1)}$ is an angle of incidence of the first focus beam corresponding to the angle subtended between the first focus beam emanating from the first measuring light source and the x axis, $\theta_0^{(2)}$ is an angle of incidence of the second focus beam corresponding to the angle subtended between the second focus beam emanating from the second measuring light source and the x axis, $y_L^{(1)}$ is a value representing the y coordinate of the location at which the reflected first focus beam is detected, and $y_L^{(2)}$ is a value representing the y coordinate of the location at which the reflected second focus beam is detected.

11. An immersion exposure apparatus comprising:
a light source;
a stage to which a substrate is to be mounted;
an optical system interposed in the apparatus between the light source and the stage so as to project light emitted by the light source onto a substrate mounted to the stage; and
an auto-focus system comprising optical components including measuring light sources each of which emits a focus beam, and sensors each operative to output a signal indicative of a location at which a beam of light of the type emitted by the light sources is received thereon,
the optical components being arranged to direct the focus beams emitted by the measuring light sources at different angles, respectively, towards the substrate mounted on the stage, wherein the angle at which the focus beam propagates towards the substrate mounted on the stage is defined as the angle subtended between the focus beam and a plane that is parallel to an upper surface of the stage, and
such that the sensors receive the focus beams reflected from the substrate such that the sensors will output signals indicative of locations at which the reflected focus beams are received thereon, and
control means operatively connected to the sensors so as to receive the signals output by the sensors, the control means comprising a calculation unit configured to incorporate together values representing the relative locations from which the focus beams emanate from the light sources, values representing the angles at which the focus beams propagate towards the substrate, and values representing the locations at which the reflected focus beams are received on the sensors, respectively, and thereby calculate a focus changing value indicative of the position of a surface of the substrate mounted to the stage relative to a reference plane, and the control means operatively connected to the stage so as to control the position of the stage relative to the optical system based on the focus changing value.

12. The apparatus according to claim 11, wherein said control means further comprises:
a stage controller that compares the focus changing value with a focus reference value of the substrate and outputs a control signal representative of the difference between the focus changing value and the reference value, and
a stage driving unit operatively connected to the stage controller and to the stage so as to receive the control signal from the stage controller and drive the stage by an amount based on the control signal.

13. The apparatus according to claim 11, wherein the measuring light sources comprise a first measuring light source oriented to emit a first focus beam to a fixed location and a second measuring light source oriented to emit a second focus beam to the fixed location.

14. The apparatus according to claim 13, wherein the sensors comprise a first sensor positioned in the apparatus to receive the first focus beam and a second sensor positioned in the apparatus to receive the second focus beam.

15. The apparatus according to claim 14, wherein the calculation unit is configured to execute an algorithm represented by the following equation:

$$f = \frac{1}{2}\left(\frac{-\theta_0^2(y_0^{(1)} + y_L^{(1)}) + \theta_0^1(y_0^{(2)} - y_L^{(2)})}{(\theta_0^{(1)} - \theta_0^{(2)})}\right)$$

based on an x, y coordinate system in which the x axis is parallel to the stage and the y axis is perpendicular to the stage, and wherein f is the focus changing value, $y_0^{(1)}$ is a value representing the y coordinate of the location from which the first focus beam emanates from the first measuring light source, $y_0^{(2)}$ is a value representing the y coordinate of the location from which the second focus beam emanates from the second measuring light source, $\theta_0^{(1)}$ is an angle of incidence of the first focus beam corresponding to the angle subtended between the first focus beam emanating from the first measuring light source and the x axis, $\theta_0^{(2)}$ is an angle of incidence of the second focus beam corresponding to the angle subtended between the second focus beam emanating from the second measuring light source and the x axis, $y_L^{(1)}$ is a value representing the y coordinate of the location at which the reflected first focus beam is received by the first sensor, and $y_L^{(2)}$ is a value representing the y coordinate of the location at which the reflected second focus beam is received by the second sensor.

16. The apparatus according to claim 11, and further comprising an immersion medium occupying a gap between the optical system and the stage.

17. The apparatus according to claim 16, wherein the immersion medium is a liquid.

18. The apparatus according to claim 16, wherein the measuring light sources comprise a first measuring light source oriented to emit a first focus beam to a fixed location and a second measuring light source oriented to emit a second focus beam to the fixed location.

19. The apparatus according to claim 18, wherein the sensors comprise a first sensor positioned in the apparatus to receive the first focus beam and a second sensor positioned in the apparatus to receive the second focus beam.

20. The apparatus according to claim 19, wherein the calculation unit is configured to execute an algorithm represented by the following equation:

$$f = \frac{1}{2}\left(\frac{-\theta_0^2(y_0^{(1)} + y_L^{(1)}) + \theta_0^1(y_0^{(2)} - y_L^{(2)})}{(\theta_0^{(1)} - \theta_0^{(2)})}\right)$$

based on an x, y coordinate system in which the x axis is parallel to the stage and the y axis is perpendicular to the stage, and wherein f is the focus changing value, $y_0^{(1)}$ is a value representing the y coordinate of the location from which the first focus beam emanates from the first measuring light source, $y_0^{(2)}$ is a value representing the y coordinate of the location from which the second focus beam emanates from the second measuring light source, $\theta_0^{(1)}$ is an angle of incidence of the first focus beam corresponding to the angle subtended between the first focus beam emanating from the first measuring light source and the x axis, $\theta_0^{(2)}$ is an angle of incidence of the second focus beam corresponding to the angle subtended between the second focus beam emanating from the second measuring light source and the x axis,) $y_L^{(1)}$ is a value representing the y coordinate of the location at which the reflected first focus beam is received by the first sensor, and $y_L^{(2)}$ is a value representing the y coordinate of the location at which the reflected second focus beam is received by the second sensor.

* * * * *